United States Patent [19]
Voss et al.

[11] Patent Number: 5,689,471
[45] Date of Patent: *Nov. 18, 1997

[54] DUMMY CELL FOR PROVIDING A REFERENCE VOLTAGE IN A MEMORY ARRAY

[75] Inventors: Peter H. Voss, Aromas; Jeffrey L. Linden, Campbell, both of Calif.

[73] Assignee: Cypress Semiconductor Corp., San Jose, Calif.

[*] Notice: The term of this patent shall not extend beyond the expiration date of Pat. No. 5,453,950.

[21] Appl. No.: 579,079

[22] Filed: Dec. 22, 1995

Related U.S. Application Data

[63] Continuation-in-part of Ser. No. 522,991, Sep. 8, 1995, which is a continuation of Ser. No. 377,952, Jan. 24, 1995, Pat. No. 5,453,950.

[51] Int. Cl.⁶ .................................... G11C 11/34
[52] U.S. Cl. .................... 365/210; 365/156; 365/174
[58] Field of Search .......................... 365/210, 156, 365/174

[56] References Cited

U.S. PATENT DOCUMENTS

| | | | |
|---|---|---|---|
| 4,724,530 | 2/1988 | Dingwall | 365/156 |
| 4,872,141 | 10/1989 | Plus et al. | 365/154 |
| 5,218,570 | 6/1993 | Pascucci et al. | 365/210 |
| 5,279,079 | 1/1994 | Ha | 365/210 X |
| 5,289,432 | 2/1994 | Dhong et al. | 365/230.05 |
| 5,301,147 | 4/1994 | Guo et al. | 365/154 |
| 5,315,545 | 5/1994 | Guo et al. | 365/156 |
| 5,317,537 | 5/1994 | Shinagawa et al. | 365/210 X |
| 5,353,251 | 10/1994 | Uratani et al. | 365/156 X |
| 5,453,950 | 9/1995 | Voss et al. | 365/156 |

FOREIGN PATENT DOCUMENTS

| | | | |
|---|---|---|---|
| 2062391 | 5/1981 | European Pat. Off. | 365/154 |
| 0026997 | 2/1986 | Japan | 365/154 |

OTHER PUBLICATIONS

Feb. 26, 1993 IEEE International Solid–State Circuits Conference, Session 16—Static Memories, Digest of Technical Papers, Paper FA 16.6, Entitled: A Single Bitline Cross–Point Cell Activation (SCPA) Architecture of Ultra Low Power SRAMs.

Feb. 26, 1993 IEEE International Solid–State Circuits Conference, Session 16—Static Memories, Digest of Technical Papers, Paper FA 16.5, Entitled: A 16 Mb CMOS SRAM with a 2.3mm2 Single–Bit–Line Memory Cell.

*Primary Examiner*—Son T. Dinh
*Attorney, Agent, or Firm*—Blakely, Sokoloff, Taylor & Zafman, LLP

[57] ABSTRACT

A dummy cell in a memory array. The memory array includes a storage element for storing one of a first and a second state. The storage element is coupled to circuitry for reading the first or second state from the storage element. The storage element draws a first current when the first state is read by the circuitry. The storage element and circuitry are further coupled to the dummy cell which provides a reference voltage when the circuitry reads the first or second state from the storage element. The dummy cell draws a second current when the circuitry reads the first or second state from the storage element. The second current is not equivalent to the first the first current. In one embodiment, the dummy cell draws approximately half the current that the storage element draws when the circuitry reads the first state from the storage element. In another embodiment, the dummy cell includes a pass transistor which has a width which is approximately half the width of a pass transistor included in the storage element. In still another embodiment, the dummy cell includes a pass transistor which has a length which is approximately twice the length of a pass transistor included in the storage element.

18 Claims, 8 Drawing Sheets

100 →

120 →

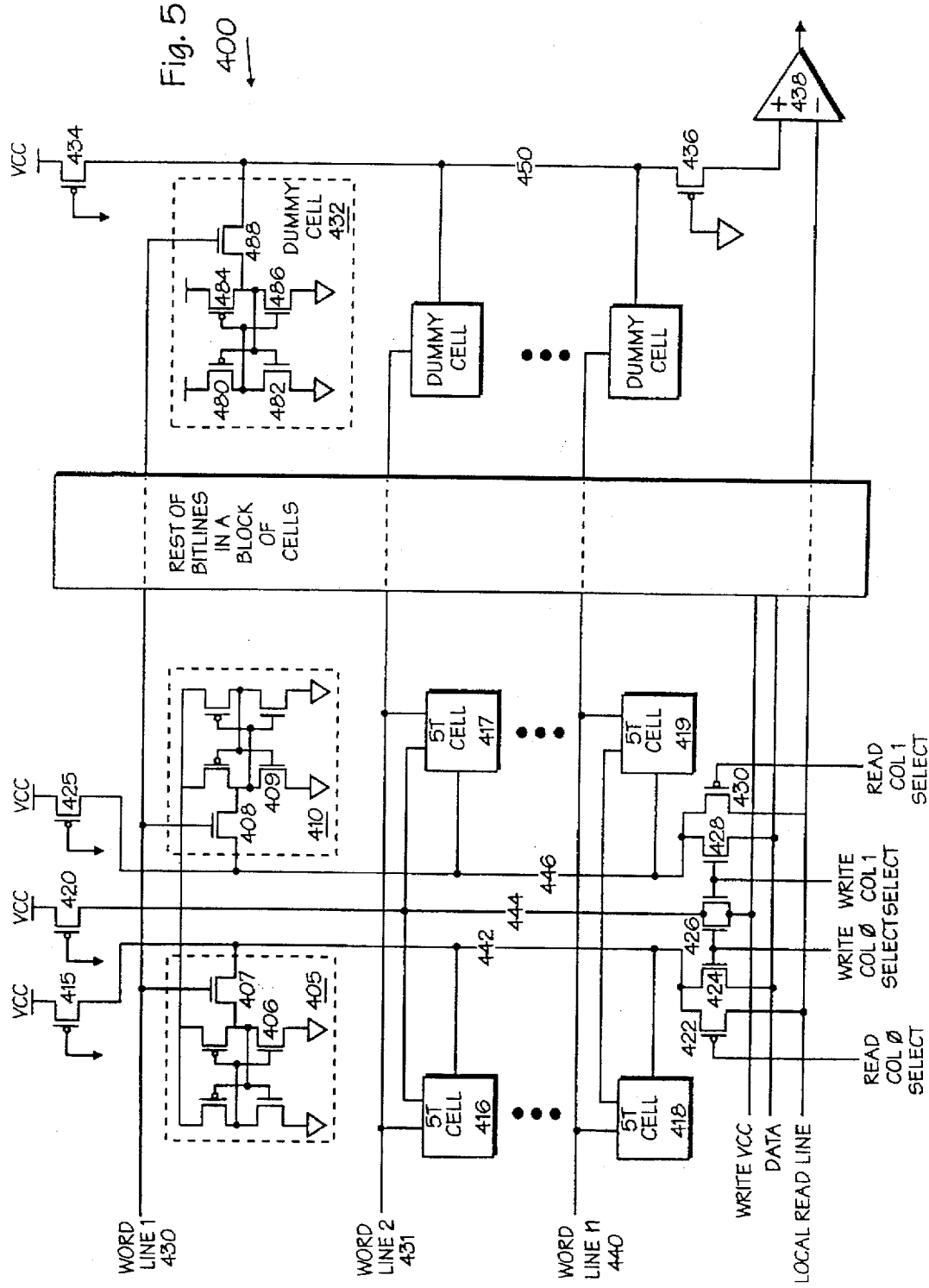

DUMMY CELL FOR PROVIDING A REFERENCE VOLTAGE IN A MEMORY ARRAY

CROSS-REFERENCE TO RELATED APPLICATIONS

This is a continuation-in-part of application entitled "A FIVE TRANSISTOR MEMORY CELL WITH SHARED POWER LINE," Ser. No. 08/522,991, filed Sep. 8, 1995, which is a continuation of U.S. Ser. No. 377,952, filed Jan. 24, 1995, now U.S. Pat. No. 5,453,950.

FIELD OF THE INVENTION

The present invention relates to the field of storing data, and more particularly to storing data in a five transistor static random access memory (SRAM) cell.

BACKGROUND OF THE INVENTION

Integrated circuits utilize metal lines to provide conductivity within the circuit. Typically, memory arrays are constructed with a plurality of metal lines arranged in a number of columns and rows. The column lines are known as bitlines, and the rows lines are know as word lines. As process technology advances, the metal lines become smaller in their pitch (i.e. the distance between the metal lines is decreased). Although a smaller pitch for metal lines in an integrated circuit decreases the size of the circuit, such as the memory array, the decreased pitch introduces other problems. For example, for the memory array, the closer metal bitlines result in increased parasitic coupling between the bitlines. In order to reduce parasitic coupling between bitlines in such memory arrays, it is desirable to reduce the number of metal bitlines required in a memory array.

FIG. 1a illustrates a prior art static random access memory (SRAM) cell 100 utilizing a single bit line cross-point cell activation architecture. The memory cell 100 contains two cross-coupled inverters coupled to a single bitline 110 via n-channel metal oxide field effect transistors (MOSFETs) 112 and 114. The n-channel transistors 112 and 114 are controlled by an X address and a Y address. The memory cell 100 is constructed of two cross-coupled complimentary metal oxide semiconductor (CMOS) inverters 116 and 118 using a PMOS thin film transistor (TFT) as a load element.

The single bit line cross-point cell activation architecture uses a single bit line that is shared by a neighboring cell (not shown). Because of this, only three metal bitlines are required for two cells. However, because the memory cell 100 contains two stable points, one on each side of inverters 116 and 118, one of the stable points is reached for writing a high logic level to the input of inverter 116 by boosting the voltage of the X and Y wordlines above the operating voltage during the write cycle. A major disadvantage with the memory cell 100 configuration is that the bootstrapping technique, which requires generation of a voltage above the operating voltage, has negative ramifications. For a further explanation of the prior art memory cell 100, see IEEE International Solid State Circuits Conference, session 16, Static Memories, paper FA16.6, entitled, "A Single Bitline Cross-Point Cell Activation (SCPA) Architecture for Ultra Low Powered SRAMs," by Motomu Ukita, et al.

FIG. 1b illustrates a second prior art memory cell 120 that utilizes a single bitline architecture. In general, the SRAM cell 120 utilizes the full six transistor memory cell arrangement with thin film transistor (TFT) loads. Included in the six transistor memory cell are pass transistors 122 and 124. The pass transistors 122 and 124 couple both sides of the cell to a single bitline 126. The pass transistor 122 is controlled by an upper wordline 128, and the pass transistor 124 is controlled by a lower wordline 130. Therefore, the memory cell 120 requires separate control of the corresponding pass gates to pulse data into the cell.

Because the SRAM cell 120 is coupled to both fie upper wordline 128 and the lower wordline 130 as shown in FIG. 1b, the scheme produces longer than required write pulse widths. Therefore, the prior art SRAM cell 120 sacrifices speed performance for the reduced bitline architecture. Although the memory cell 120 does not use the bootstrapping approach to write to both sides of the cell, a major disadvantage with this architecture is the longer write cycles and the use of six transistors for each cell. For a further explanation of the prior art SRAM cell 120, see the IEEE International Solid State Circuits Conference, 1993, session 16, Static Memories, paper FA 16.5, entitled, "A 16 Mb CMOS SRAM With a 2.3 Micrometer Single-Bit-Line Memory Cell," by Katsuro Sasaki, et al.

FIG. 1c illustrates a prior art SRAM device 140 in which the prior art memory cell 100 described in FIG. 1a is implemented. The SRAM device 140 contains memory cells 146 and 160 which each comprise CMOS inverters 116 and 118 as illustrated in FIG. 1a. Memory cell 146 is coupled to bit line 168 at node 178 via n-channel transistors 148 and 150. Memory cell 160 is coupled to bit line 170 at node 180 via n-channel transistors 158 and 156. N-channel transistors 148 and 158 are controlled by X address 172. N-channel transistor 150 is control by Y address 174, and n-channel transistor 156 is controlled by Y address +1 176. SRAM device 140 further contains dummy cells 152 and 154. Dummy cell 152 is coupled to bit line 168 at node 178 and Y address +1 176 at node 184. Dummy cell 154 is coupled to bit line 170 at node 180 and Y address 174 at node 182. Bitline 168 has a p-channel transistor bitline load 142 and a p-channel transistor bitline load 162 controlled by Y address 174. Bitline 170 has a p-channel transistor bitline load 144 and a p-channel transistor bitline load 164 controlled by Y address +1 176. SRAM device 140 further comprises sense amplifier 166 which senses a differential voltage between a selected bitline and a dummy cell bitline.

FIG. 1d illustrates dummy cell 152. Dummy cell 154 comprises the same architecture as dummy cell 152. Dummy cell 152 contains a first pair of n-channel transistors 194 and 196 coupled in series and controlled by Y address +1 176 at node 184. N-channels transistors 194 and 196 are coupled to n-channel transistor 192 which provides a conductive path to ground. N-channel transistors 194 and 196 are also coupled to bit line 168 at node 178. Dummy cell 152 provide a reference voltage at node 178 which is adjusted to a middle level by controlling both the dummy cell and the bitline loads 142, 144, 168 and 170.

Conventionally, the transistor sizes of n-channel transistors 194 and 196 are manufactured to match the size of pass gases such as n-channel transistors 148 and 150 and n-channel transistors 156 and 158, such that the dummy cell will draw the same amount of current as the memory cell when the memory cell is being read. A middle level reference voltage is provided by the dummy cell to a sense amplifier, such as sense amplifier 166 by adjusting the sizes of the p-channel transistor bitline loads, such as 142, 144, 162 and 164. By simply adjusting the sizes of the p-channel transistor bitline loads the prior art dummy cells do not provide a middle level reference voltage that tracks well with process variations or operating conditions in an SRAM device.

Therefore, it is desirable to provide a memory array which has a dummy cell that can provide a reference voltage that tracks well with changes in the manufacturing process and changes in operating conditions, and which does not adjust the size of the bitline loads to accomplish the reference voltage.

SUMMARY AND OBJECTS OF THE INVENTION

The present invention provides a memory array which includes a dummy cell and a memory cell. The dummy cell provides a reference voltage when a state is read from the memory cell. When the memory cell is being read, the dummy cell provides a reference voltage and draws a different current from the current drawn by the memory cell. The reference voltage provided by the dummy cell tracks well with changes in the manufacturing process and changes in operating conditions. The present invention does not require adjusting the size of bitline loads to accomplish the reference voltage.

In one embodiment of the present invention, a memory array is disclosed which comprises a storage element for storing one of a first and a second state. The storage element is coupled to circuitry for reading the first or second state from the storage element. The storage element draws a first current when the first state is read by the circuitry. The storage element and circuitry are further coupled to a dummy cell which provides a reference voltage when the circuitry reads the first or second state from the storage element. The dummy cell draws a second current when the circuitry reads the first or second state from the storage element. The second current is not equivalent to the first current. In one embodiment, the dummy cell draws approximately half the current that the storage element draws when the circuitry reads the first state from the storage element. In another embodiment, the dummy cell includes a pass transistor which has a width which is approximately half the width of a pass transistor included in the storage element. In still another embodiment, the dummy cell includes a pass transistor which has a length which is approximately twice the length of a pass transistor included in the storage element.

The circuitry may comprise a bitline, a wordline and a sense amplifier. The bitline is coupled to the pass transistor included in the storage element. The wordline is coupled to the pass transistor included in the storage element and the pass transistor of the dummy cell. The wordline enables the first or second state to be read from the storage element and coupled to the sense amplifier. Additionally, the wordline enables the dummy cell to couple the reference voltage to the sense amplifier. When the first state is read from the storage element a first voltage is coupled to the bitline, and when the second state is read from the storage element a second voltage is coupled to the bitline. The reference voltage provided by the dummy cell comprises a value between the first and second voltages. In one embodiment, the reference voltage comprises the average of the first and second voltages.

In another embodiment the present invention comprises a circuit for storing and reading data. The circuit contains storage cells having two stable points including a first side for storing a first state and a second side for storing a second state opposite the first state. In a memory array, a first data bitline is coupled to the first side of a first storage cell, and a second bitline is coupled to the first side of the second storage cell. Therefore, the storage cells are accessed on one side only. The storage cells are coupled to receive power at an operating voltage, and are coupled to ground. The memory array is configured such that only three bitlines are required for two cells. Additionally, a control circuit reads and writes to the storage cells. When the control circuit reads the first state comprising a low logic level from the first or second storage element, the first or second storage element draws a first current. The circuit further contains a dummy cell providing a reference voltage which is coupled to the first and second storage elements. The dummy cell draws a second current when the circuitry reads from the first or second storage element the first state comprising a low logic level. The second current is not equivalent to the first current. In one embodiment, the dummy cell draws approximately half the current that the first or second storage elements draw when the circuitry reads the first state comprising a low logic level from the storage element. In another embodiment, the dummy cell includes a pass transistor which has a width which is approximately half the width of pass transistors included in the first and second storage elements. In still another embodiment, the dummy cell includes a pass transistor which has a length which is approximately twice the length of pass transistors included in the first and second storage elements. The storage cells and dummy cells may comprise static random access memory cells (SRAM) that contain five MOS transistors.

Additionally, the control circuit executes a special write operation to write a low logic level on the second side of the storage cells. The control circuit is coupled to the first, second, and third bitlines. When storing a low logic level on the second side of the first storage cell, the control circuit generates a first voltage on the third bitline so that the effective operating voltage applied across the first and second storage cells is lower than the operating voltage. The control circuit also generates a second voltage on the second bitline that is lower than the operating voltage. To perform a special write operation on the second storage cell, the control circuit generates the first voltage on the third bitline and the second voltage on the first bitline. In one embodiment, the first voltage is set to one transistor threshold voltage below the operating voltage, and the second voltage is set to a voltage equal to approximately one half the operating voltage.

A novel method for reading data from a memory array is also disclosed. The novel method includes storing one of a first state and a second state in a storage element. Reading the first or second state from the storage element. The storage element drawing a first current when the first state is read by a circuitry. Providing a reference voltage from a dummy cell when said first or second state is read from the storage element. The dummy cell drawing a second current when the first state is read from the storage element. The second current not equal to the first current.

Other objects, features and advantages of the present invention will be apparent from the accompanying drawings, and from the detailed description that follows below.

BRIEF DESCRIPTION OF THE DRAWINGS

The objects, features, and advantages of the present invention will be apparent from the following detailed description of the invention with references to the following drawings.

FIG. 5 illustrates a memory array configured in accordance with one embodiment of the present invention.

DETAILED DESCRIPTION

Figure 1A:
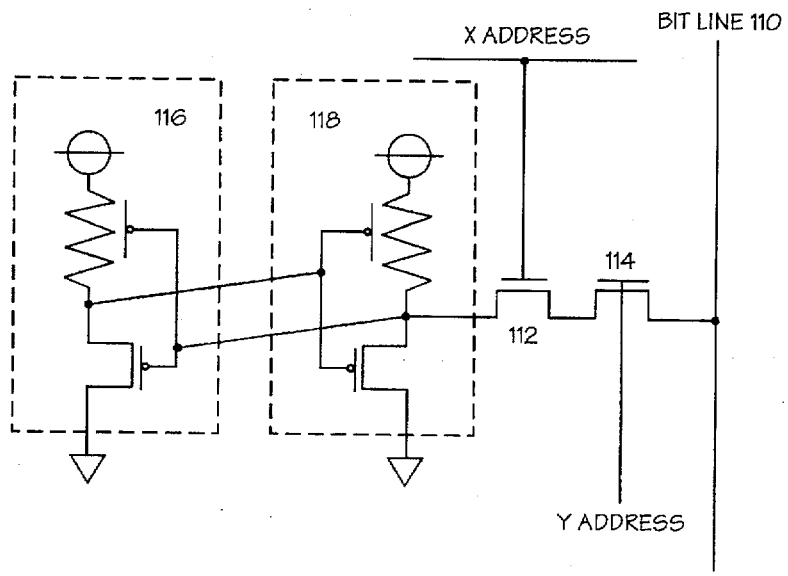
FIG. 1a illustrates a prior art static random access memory (SRAM) cell utilizing a single bit line cross-point cell activation architecture.
Figure 1B:
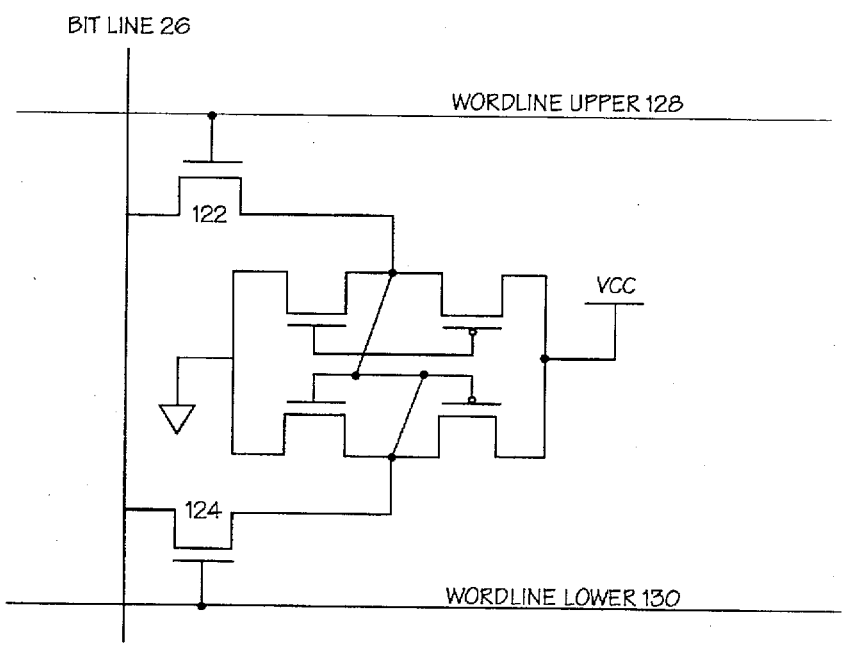
FIG. 1b illustrates a second prior art memory cell that utilizes a single bitline architecture.
Figure 1C:
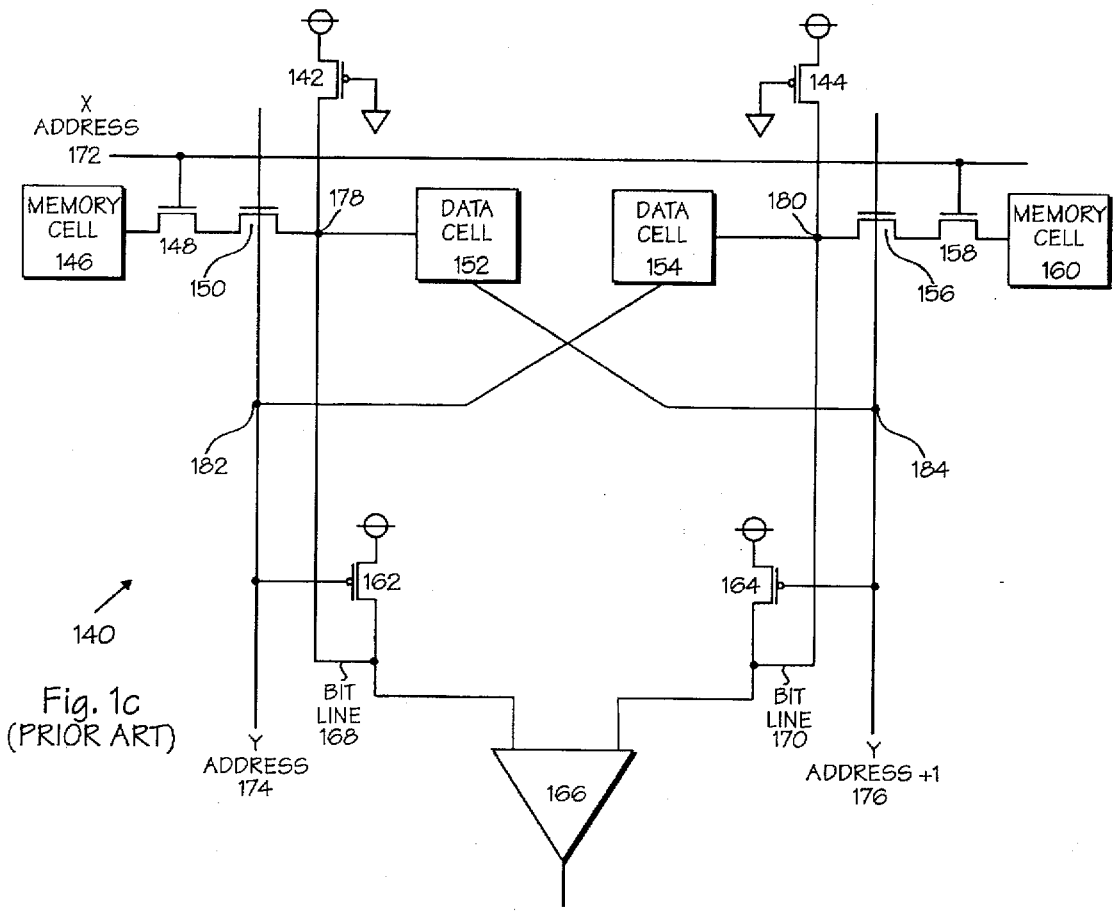
FIG. 1c illustrates a prior art SRAM device incorporating a dummy cell.
Figure 1D:
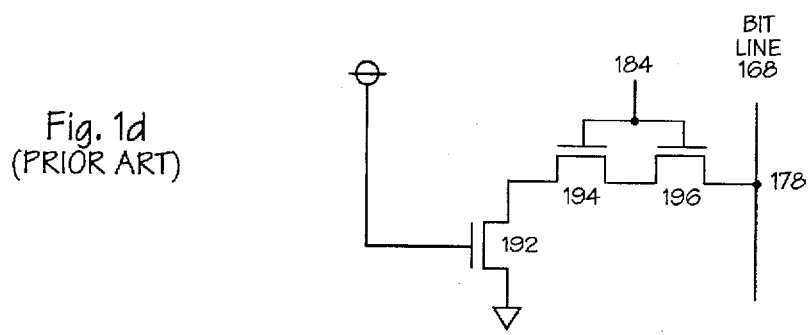
FIG. 1d illustrates the prior art dummy cell of FIG. 1c.
Figure 2:
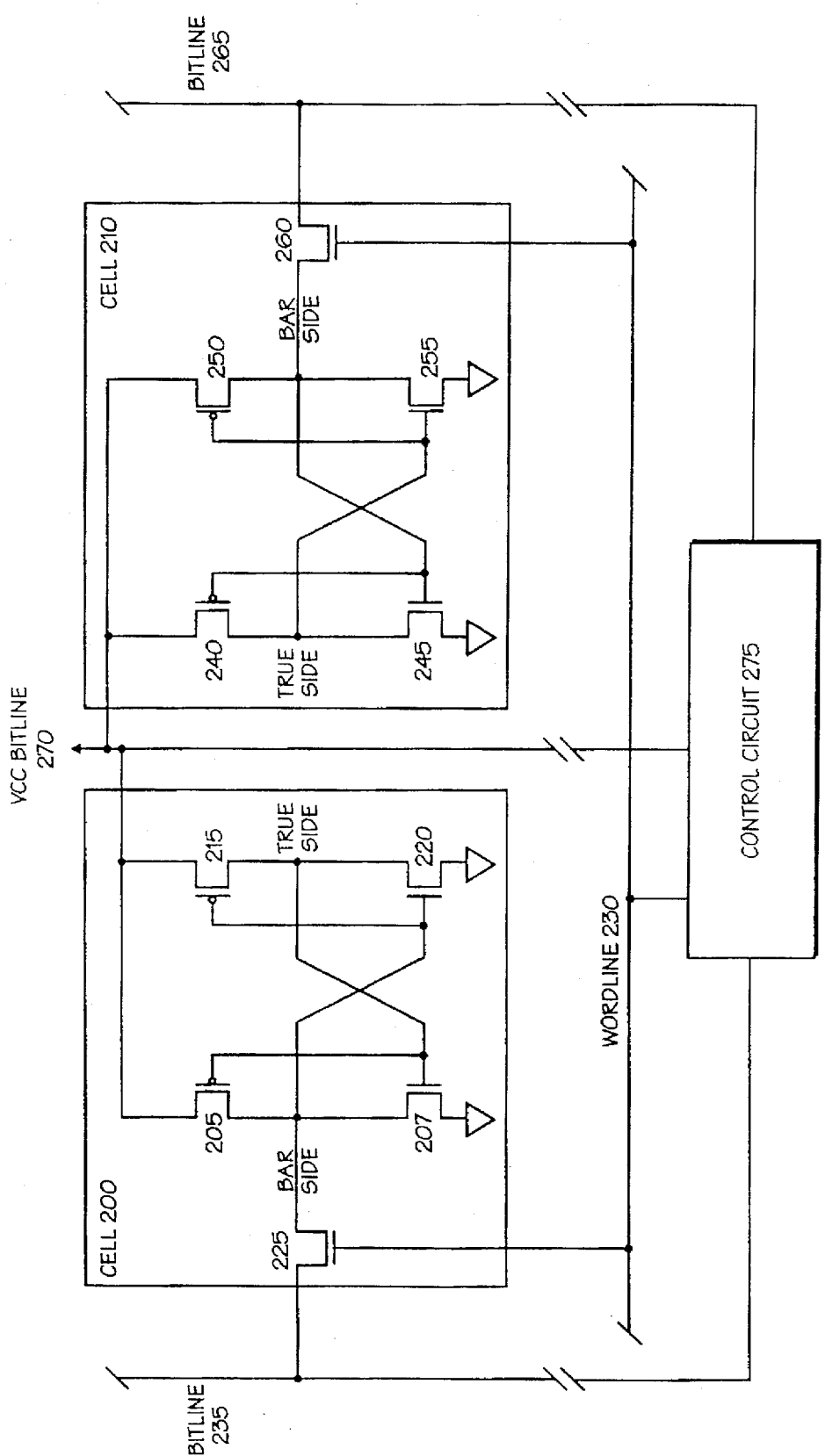
FIG. 2 illustrates two static random access memory (SRAM) cells configured in accordance with a first embodiment of the present invention.

FIG. 2 illustrates two static random access memory (SRAM) cells configured in accordance with a first embodiment of the present invention. Although FIG. 2 illustrates the configuration of two SRAM cells, a plurality of SRAM cells may be configured in an array in accordance with the teachings of the present invention. An array for implementing the five transistor cells of the present invention is described more fully below. Each SRAM cell, such as SRAM cell 200 and SRAM cell 210 shown in FIG. 2, contains five transistors. Specifically, SRAM cell 200 contains a first complimentary metal oxide semiconductor (CMOS) inverter including p-channel transistor 205 and n-channel transistor 207, cross-coupled with a second CMOS inverter including p-channel transistor 215 and n-channel transistor 220. Similarly, SRAM cells 210 also contains two cross-coupled CMOS inverters including p-channel transistors 240 and 250, and n-channel transistors 245 and 255.

The SRAM cells 200 and 210 each include a bar side and a true side that are both stable points for storing two opposite states. As shown on FIG. 2, the true side of SRAM cell 200 is the output of the CMOS inverter containing p-channel transistor 215 and n-channel transistor 220, and the bar side of SRAM 200 is the output of the CMOS inverter containing p-channel transistor 205 and n-channel transistor 207. Similarly, the SRAM cell 210 contains a true side and a bar side as labeled on FIG. 2. The five transistor SRAM cell of the present invention further includes a single pass transistor for each cell, such as n-channel transistor 225 for SRAM cell 200 and n-channel transistor 260 for SRAM 210. Consequently, only one side of the SRAM cell is accessed for reading and writing data to the SRAM cell.

Although SRAM cells 200 and 210 are shown as a five transistor CMOS SRAM cell, other technologies, well known for constructing static RAM cells, may be used without deviating from the spirit and scope of the invention. All that is required to utilize the teachings of the present invention is that the memory cell contain two stable points with only a single access point to one of the stable points.

As shown in FIG. 2, three bit lines are utilized to access the two memory cells 200 and 210. Specifically, a first bit line 238 is coupled to the "bar side" of SRAM cell 200 via the pass transistor 225, and a second bit line 265 is coupled to the bar side of SRAM cell 210 via the pass transistor 260.

For the first embodiment, a third bit line, shown as bit line 270 on FIG. 2, couples power to the source terminals of p-channel transistors 205, 215, 240 and 250. The gates of pass transistors 225 and 260 are coupled to a word line 230. As is well known in the art, the word line 230, when activated, selects a particular row of memory cells in a memory array. The bitlines 235, 265, and 270 and the wordline 230 is coupled to a control circuit 275. In general, the control circuit 275 permits reading and writing to the SRAM cells 200 and 210 through control of the bitlines 235, 265, and 270 and the wordline 230.

As is illustrated in FIG. 2, the static RAM configuration of the present invention substantially reduces the number of bit lines required for a memory array (e.g. only three bitlines are required for two memory cells). As discussed above, as technology advances, metal lines on integrated circuit devices have smaller pitches. With use of the present invention, the number of metal lines required in the column pitch for two SRAM cells is reduced from four lines to three lines. The three-column pitch for the two memory cell configuration is an advantage in both yield and in reducing the parasitic coupling between bit lines. For example, in a four-column pitch configuration, the additional bit line necessitates that the bit lines are located closer to one another.

In order to read from the five transistor cell configuration of the present invention, such as SRAM cells 200 and 210, a common reference line technique is utilized. For example, in order to read the state of static RAM cell 200, the control circuit 275 generates an active high logic level on the wordline 230 to bias the gate of the n-channel transistor 225 (pass transistor), thereby providing an electrical path from the bar side of SRAM 200 to the bitline 235. The state on bitline 235 is compared with a state sensed from a dummy reference cell. Note that the "bar side" of the SRAM cell is sensed, and therefore reverse logic is used to generate an output indicating the true state of the cell.

In order to write a high logic level to the true side of SRAM cells 200 and 210, a normal SRAM write operation may be executed. For example, to write a high logic level to the true side of SRAM cell 200, the control circuit 275 charges the wordline 230 to bias the pass transistors 225 and 260, thereby electrically coupling the bar sides of SRAM cells 200 and 210 to the respective bitlines 235 and 265. The control circuit 275 generates a low logic level on the bitline 235, such that the low logic level is input to the SRAM cell 200 on the bar side. The low logic level input to the bar side of the SRAM cell 200 results in biasing the n-channel transistor 220 to turn off and the p-channel transistor 215 to turn on. This operation results in a high logic level being generated on the true side of SRAM cell 200.

Although the normal SRAM write operation may be utilized to write a high logic level to the true side of the SRAM cells through use of only a single access point on the bar side of the cell, a special write operation is required to drive the true side of the five transistor SRAM cell configuration to a low logic level (i.e. because the true side of the five transistor SRAM cell configuration of the present invention is not coupled to a pass gate). In one embodiment, to write a low logic level to the true side of SRAM cell 200, the wordline 230 is driven to an active high logic level similar to a normal write operation. In addition, the control circuit 275 generates a first voltage level on the bitline 270 that is below the operating voltage, $V_{cc}$, and drives the bitline 265 for the SRAM cell 210 to a second voltage level that is also less than the operating voltage, $V_{cc}$. Also, to complete the special write operation to the SRAM cell 200, the control circuit 275 drives the bitline 235 to a high logic level for input to the SRAM 200 on the bar side.

In one embodiment, for the special write operation to the SRAM cell 200, the voltage on the bitline 265 is set to approximately one half of the operating voltage (e.g. $V_{cc}/2$), and the voltage on the bitline 270 is set to a voltage approximately equal to $V_{cc}$ minus a threshold voltage of the MOS transistors. With the reduction of operating voltage $V_{cc}$ on the SRAM cell 200, the true side of SRAM cell 200 is driven to a low logic level without the need of an additional pass transistor coupled to the true side of the cell. Because SRAM cell 200 and SRAM cell 210 share a common $V_{cc}$ bitline 270, the lowering of the operating voltage $V_{cc}$ affects both the SRAM cells 200 and 210. Therefore, the control circuit 275 drives the bitline 265 to the second voltage level to retain the state currently stored in the SRAM cell 210. Therefore, the SRAM cell 210 is not affected by the special write operation to the SRAM cell 200. The special write operation to the SRAM cell 210 is similar except that the operation on the bitlines 235 and 265 is reversed.

As described above, the memory cells 200 and 210 illustrated in FIG. 2 are coupled to a first data bitline 235, a second data bitline 265, and a $V_{cc}$ bitline 270. An additional ground or $V_{ss}$ bitline may be provided to couple n channel transistors 210 and 220 in the memory cell 200 and n channel transistors 245 and 255 in the memory cell 210 to ground. For the additional $V_{ss}$ bitline configuration, two memory cells share a common $V_{ss}$ bitline. Memory cells in an array that are positioned as the first or last cell in a row are coupled to a half a $V_{ss}$ bitline. As an alternative embodiment to the additional $V_{ss}$ bitline configuration, the n channel transistors 210 and 220 in the memory cell 200 and n channel transistors 245 and 255 in the memory cell 210 are coupled to ground via a poly silicon connection formed as a row across the memory cells.

Figure 3:
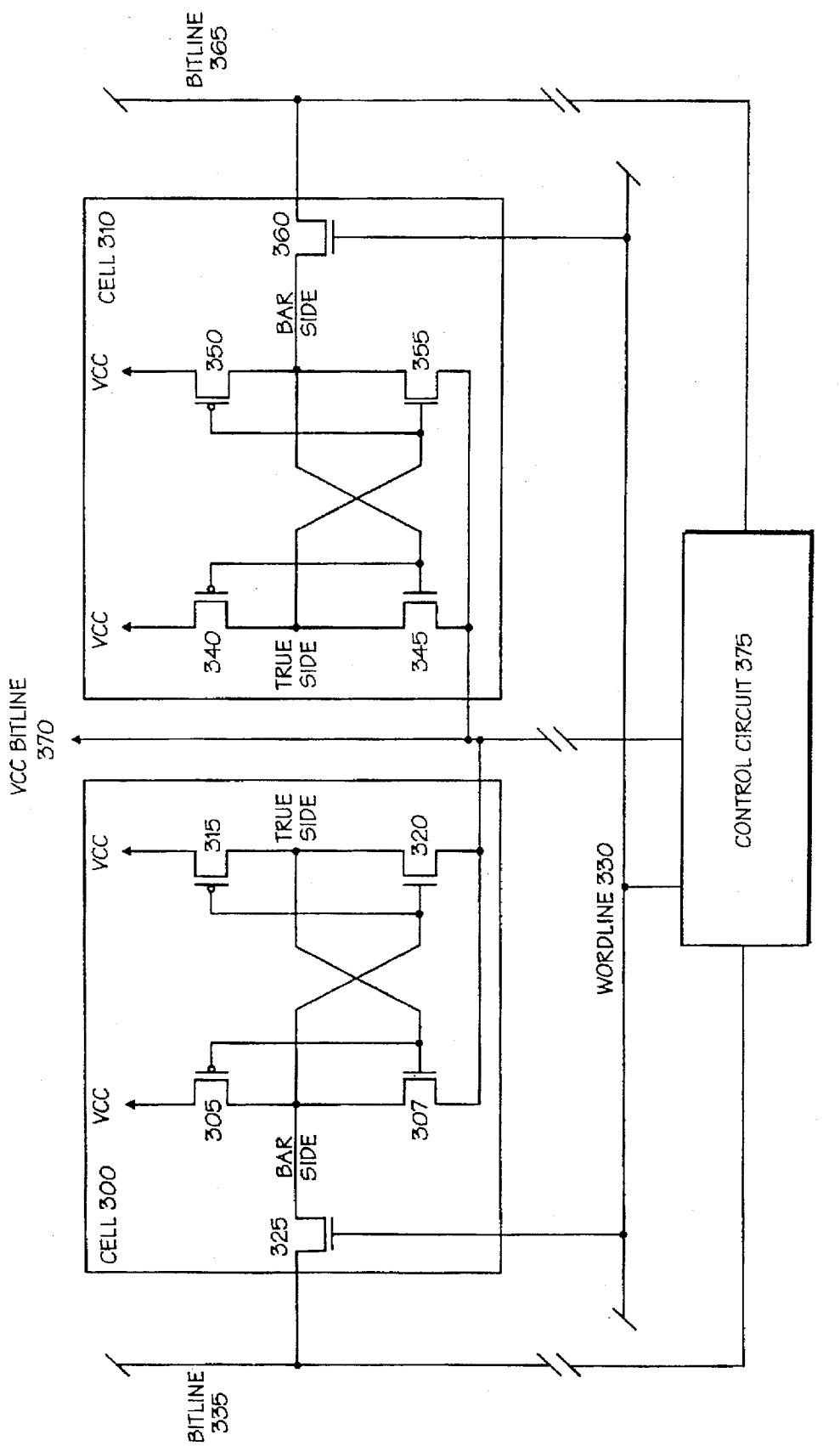
FIG. 3 illustrates two static random access memory (SRAM) cells configured in accordance with a second embodiment of the present invention.

FIG. 3 illustrates two static random access memory (SRAM) cells configured in accordance with a second embodiment of the present invention. The second embodiment illustrated in FIG. 3 is configured similar to the first embodiment illustrated in FIG. 1 except that the third bitline 370 is a ground or $V_{ss}$ bitline. The $V_{ss}$ bitline 370 is common to memory cells 300 and 310 such that the $V_{ss}$ bitline 370 is coupled to the source of n channel transistors 307 and 320 in cell 300 and to the source of n channel transistors 345 and 355 in cell 310.

For the special write operation to the SRAM cell 300, the voltage on the bitline 365 is set to approximately one half of the operating voltage (e.g. $V_{cc}/2$), and the voltage on the $V_{ss}$ bitline 370 is set to a voltage approximately equal to a threshold voltage of the MOS transistors. By generating a first voltage on the $V_{ss}$ bitline 370, the true side of SRAM cell 300 is driven to a low logic level without the need of an additional pass transistor coupled to the true side of the cell. Because SRAM cell 300 and SRAM cell 310 share a common $V_{ss}$ bitline 370, the generation of the first voltage on the $V_{ss}$ bitline 370 affects both the SRAM cells 300 and 310. Therefore, the control circuit 375 drives the bitline 365 to the second voltage level to retain the state currently stored in the SRAM cell 310. Accordingly, the SRAM cell 310 is not affected by the special write operation to the SRAM cell 300. The special write operation to the SRAM cell 310 is similar except that the operation on the bitlines 335 and 365 is reversed.

FIGS. 4a-f illustrate one embodiment of voltage waveforms for the special write operation to the SRAM cell 200.

Figure 4A:
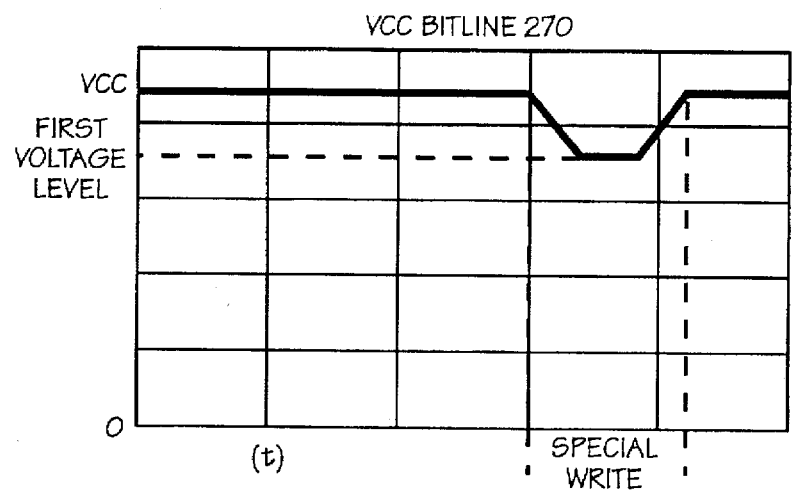
FIGS. 4a–f illustrate one embodiment of voltage waveforms for the special write operation to the SRAM cell of the present invention.
Figure 4B:
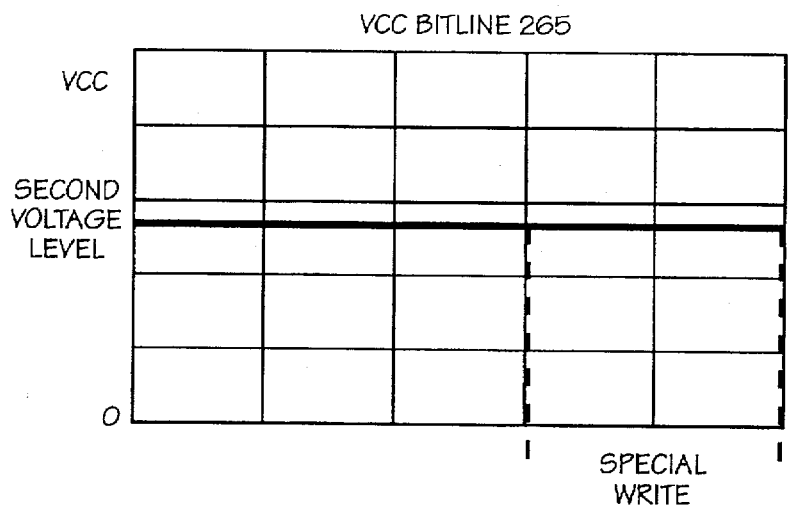
Figure 4C:
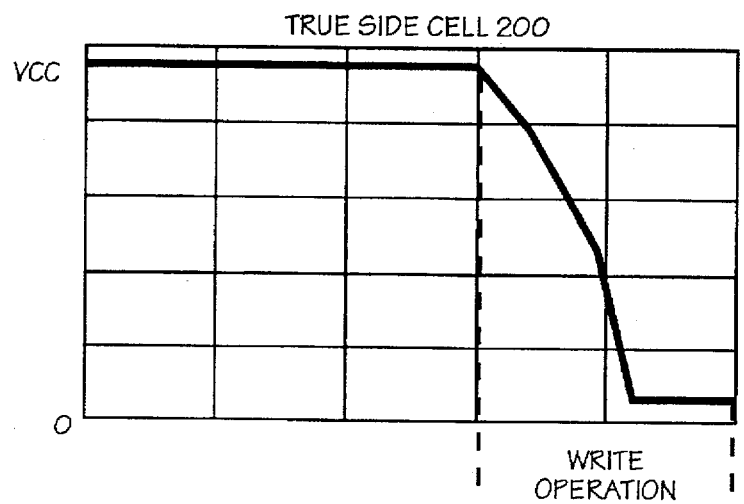
Figure 4D:
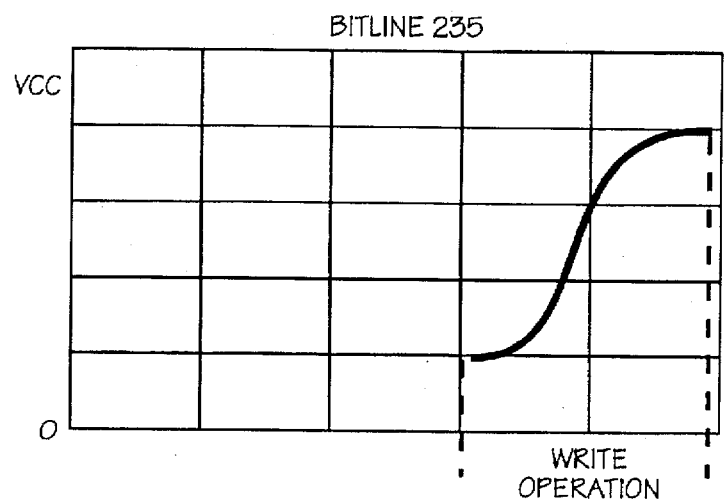
Figure 4E:
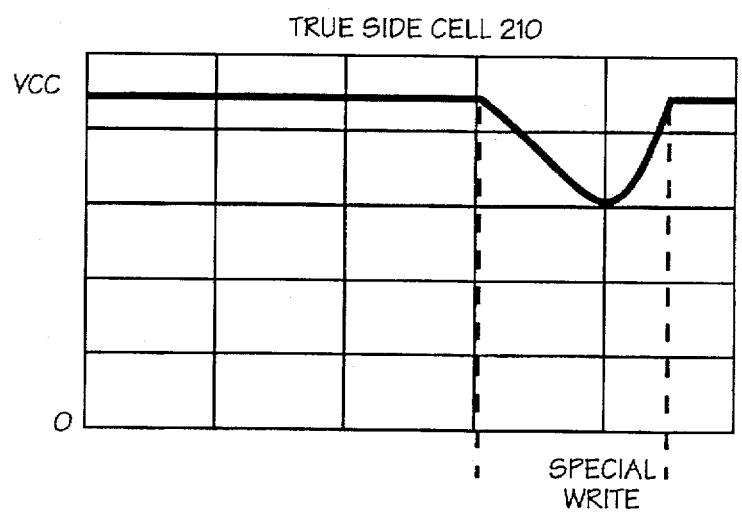
Figure 4F:
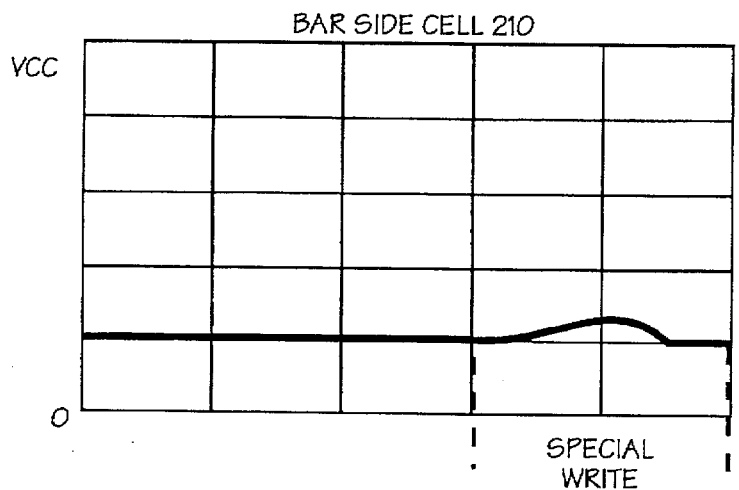

FIG. 4a shows the lowering of the voltage on the $V_{cc}$ bitline 270 to the first voltage level, and FIG. 4b shows the generation of the second voltage level on the bitline 265 for the special write operation to the SRAM cell 200. FIG. 4c illustrates the voltage waveform for the true side of the SRAM cell 200 for the special write operation when the SRAM cell 200 previously stored a high logic level. FIG. 4d illustrates the voltage waveform driven on the bitline 235 to write a low logic level to the true side of the SRAM 200. FIGS. 4e and 4f illustrate the voltage level of the true and bar sides, respectively, of the SRAM cell 210 during the special write operation when the SRAM cell 210 previously stored a high logic level.

FIG. 5 illustrates a memory array configured in accordance with one embodiment of the present invention. The memory array 400 includes a plurality of SRAM cells labeled 405, 410, 416, 417, 418 and 419 on FIG. 5. For the embodiment of FIG. 5, the SRAM cells include the five transistor SRAM cell configuration of the present invention. One embodiment for the five transistor cell is shown in SRAM cells 405 and 410. However, for simplicity, the remaining SRAM cells 416, 417, 418 and 419 are shown and labeled "5T Cell." The array 400 is arranged in a plurality of rows and columns. Specifically, the array 400 contains "n" rows that are each accessible by a corresponding wordline, 1-n. For example, wordline "1" 430 selects a first row in the memory array 400, wordline "2" 431 is used to select a second row, and wordline 440 "n" is used to select the nth row of SRAM cells. In general, the memory array 400 is arranged in a plurality of columns such that three bitlines are used for two neighboring cells. The memory array 400 may contain any number of columns that are arranged as the first two columns (e.g. the first column contains SRAM cells 405, 416, and 418, and the second column contains SRAM cells 410, 417, and 419). For simplicity, only two columns of SRAM cells are shown. In order to sense the memory cells, the memory array 400 further includes a column of dummy reference cells, including dummy reference cell 432.

The SRAM cell 405 is coupled to a first bitline labeled 442 on FIG. 5. As explained above in conjunction with a discussion of FIG. 2, the SRAM cell 405 is coupled at the "bar side" of the cell through a pass transistor. The SRAM cell 410 is coupled to a second bitline 446 on the "bar side" of the cell. The SRAM cells 405 and 410 share a common $V_{cc}$ bitline labeled 444 on FIG. 5.

In one embodiment, the control circuit 275 (FIG. 2) for the memory array 400 is configured with a plurality of MOS transistors (422, 424, 426, 428, 430) a write $V_{cc}$ line, a data line, a local read line, a read column 0 select, a read column 1 select, a write column 0 select, a write column 1 select. The state of these lines to perform a read and write operation is described below; however the generation of these signals in the memory array 400 is not shown so as to not obscure the invention. The MOS transistors (422, 424, 426, 428, 430) are required for each two columns of memory cells.

The bitline 442 is coupled to the local read line via a p-channel transistor 422, and is coupled to the data line via a n-channel transistor 424. The p-channel transistor 422 is controlled by the read column 0 select signal and the n-channel transistor 424 is controlled by the write column 0 select signal. The $V_{cc}$ bitline 444 is coupled to the write $V_{cc}$ line via a transmission gate 426, having two n-channel transistors. The transmission gate 426 is controlled by the write column 0 select and the write column 1 select signals. The control circuitry for the memory array 400 also contains a n-channel transistor 428 that couples the bitline 445 to the data line, and a p-channel 430 that couples the bitline 446 to the local read line.

In general, the write $V_{cc}$ line permits lowering the operating voltage on the $V_{cc}$ bitline 444 for the special write operation. The data line receives input data to be written to one of two of the cells in the corresponding columns. The local read line is utilized to sense the state of the SRAM cells with a common reference line technique. Each bitline further includes a bitline load transistor (e.g. bitline 442 contains p-channel transistor 415, bitline 444 contains p-channel transistor 420, and bitline 446 contains p-channel transistor 425).

In operation, in order to write a low logic level to SRAM cell 405, the write column 0 select signal is an active high logic level, and the write column 1 select signal is an inactive low logic level. In addition, the data line is pulled to a low logic level and the write $V_{cc}$ line is held at the operating voltage, $V_{cc}$. In addition, the wordline "1" 430 is activated to bias the SRAM cell 405 pass transistor to conduct from the bitline 442 into the bar side of SRAM cell 405. By generating an active high logic level signal on the write column 0 select line, the n-channel transistor 424 is biased to conduct current from the data line to the bitline 442, and the transmission gate 426 is biased to couple the $V_{cc}$ bitline 444 to the write $V_{cc}$ line. Because the write column 1 select line is set at an inactive low logic level, the bitline 446 is not coupled to the data line and the SRAM cell 410 is not affected.

To execute the special write operation of writing a high logic level to the SRAM cell 405, the write column 0 select line is set at an inactive low logic level, the write column 1 select line is set to an active high logic level, and both data and write $V_{cc}$ lines are set to an intermediate voltage (e.g. data line is set to half the $V_{cc}$ voltage, and write $V_{cc}$ is set to approximately $V_{cc}$ minus one threshold voltage). The intermediate voltage is generated on the bitline 444 by sizing the n-channel transistors in the transmission gate 426. The sizing of transistors to generate a voltage drop is well known in the art. The low logic level on the write column 0 select line turns off n-channel transistor 424, thereby permitting bitline 442 to be pulled to a high logic level through the load transistor 415 and $V_{cc}$. The high logic level on the write column 1 select line biases the transmission gate 426 to couple the $V_{cc}$ bitline 444 to the write $V_{cc}$ line, and biases n-channel transistor 428 to couple the bitline 446 to the data line. By placing the intermediate voltage on the data line, the SRAM cell 410 retains the state held prior to the write operation to the SRAM cell 405.

A write operation to the SRAM cell 410 is analogous to a write operation to SRAM cell 405 except that the write column selects are reversed. Specifically, to write a high logic level to SRAM cell 410, the write column 0 select line is set to a high logic level, the write column 1 select line is set to a low logic level, and data and write $V_{cc}$ lines are set at their intermediate voltages. In order to write a low logic level to SRAM cell 410, the write column 0 select line is driven to a low logic level, and the write column 1 select line is driven to a high logic level, the data line is set to a low logic level, and the write $V_{cc}$ line is set at $V_{cc}$.

The SRAM cells in both columns (e.g. column one and column two) are read through the local read line. For a read operation, the read column 0 select and read column 1 select lines are activated to electrically couple the corresponding bit lines to the local read line. For example, to read the state of SRAM cell 410, the read column 1 select line is set to an active low logic level to bias p-channel transistor 430 to couple the bitline 446 to the local read line. As shown in FIG. 5, the local read line is coupled to a sense amplifier 438 on the negative differential input. The sense amplifier 438 is coupled to the dummy bitline 450. When executing a read operation, the appropriate word line is activated to bias pass transistor 488 in dummy cell 432 in order to generate a reference voltage on bitline 450. The appropriate threshold drops are generated on bitline 450 through use of the p-channel bitline load transistors 434 and 436.

Dummy cell 432 comprises a five transistor cell as in SRAM cells 405 and 410. The five transistor cell of dummy cell 432 comprises a first CMOS inverter including p-channel transistor 480 and n-channel transistor 482, cross-coupled with a second CMOS inverter including p-channel transistor 484 and n-channel transistor 486. Additionally, dummy cell 432 includes a pass transistor 488 coupled to the output of the second CMOS inverter. Dummy cell 432 is designed to provide a reference voltage to bitline 450 when a state is read from SRAM cells 405 or 410. The reference voltage provided by dummy cell 432 is less than $V_{cc}$ but greater than $V_{ss}$. This may be accomplished by designing dummy cell 432 to store a low logic level at the output of its second CMOS inverter. Given the natural tendency for dummy cell 432 to stabilize with the output of the first CMOS inverter equal to one logical state and the output of the second CMOS inverter equal to an opposite logical state, dummy cell 432 may be designed to inherently stabilize with the output of the second CMOS inverter comprising a low logic level. Alternatively, a low logic level may be written to, or prestored, at the output of the second CMOS inverter of dummy cell 432. In the another configuration, dummy cell 432 may comprise the first CMOS inverter having its input coupled to a low logic level or ground and, consequently, the second CMOS inverter outputting a low logic level to pass transistor 488.

Figure 6:
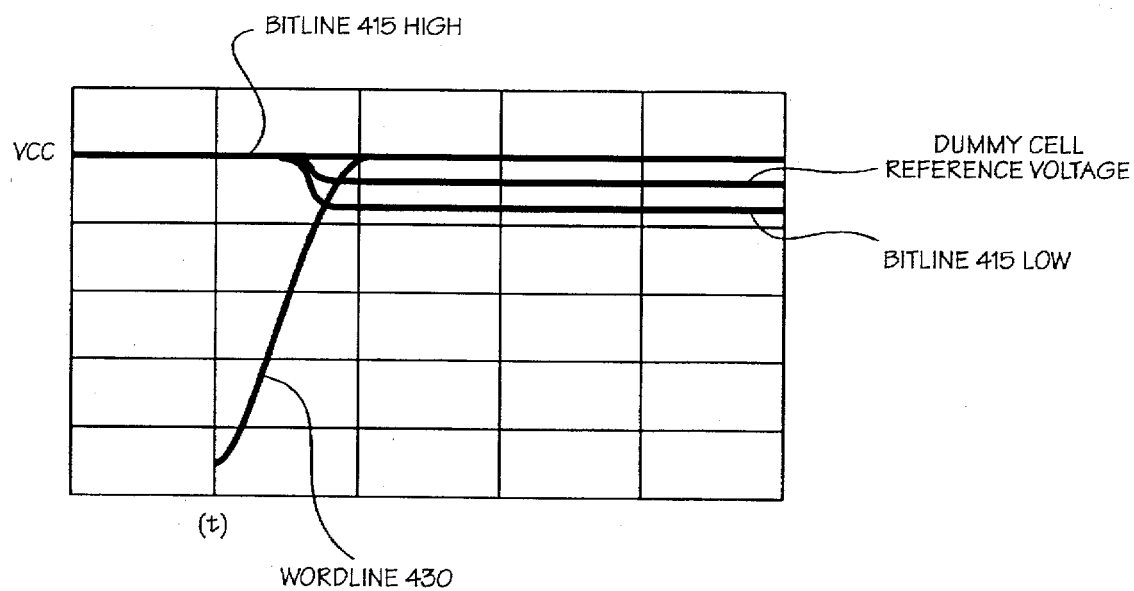
FIG. 6 illustrates one embodiment of voltage waveforms for the read operation of a memory cell and the dummy cell of the present invention.

The state of SRAM cells 405 and 410 are read in like manner. In reference to SRAM cell 405, when wordline 430 is biased to a high logic level, pass transistor 407 couples the state stored in SRAM cell 405 to bitline 415, and pass transistor 488 couples a reference voltage to bitline 450. In FIG. 5, bitline 415 is coupled to sense amplifier 438 through the local read line. As illustrated in FIG. 6, when a high logic level is read from SRAM cell 405 a first voltage is coupled to bitline 415 which is approximately equal to $V_{cc}$. When a low logic level is read from SRAM cell 405 a second voltage is coupled to bitline 415 which is less than $V_{cc}$ but greater than Vss. For example, when $V_{cc}$=5.0 V and a low logic level is read from SRAM cell 405, a second voltage of 4.70 V may be coupled to bitline 415. As illustrated in FIG. 6, dummy cells are designed to provide a reference voltage which is between the first and second voltages read from SRAM cell 405. Optimally, dummy cells are designed to provide a reference voltage which is the average, or the midpoint between the first voltage and the second voltage read from SRAM cell 405. For example, when Vcc=5.0 V and the second voltage is 4.70 V, the reference voltage provided by dummy cell 432 and coupled to sense amplifier 438 would be approximately 4.85 V.

Conventionally, during a read operation of a memory cell, a dummy cell is designed to draw the same amount of current as that drawn by the memory cell being read. This may be accomplished in memory array 400 by sizing the five transistors in dummy cell 432 the same size as the five transistors in SRAM cells 405 and 410. Alternatively, this may be accomplished by sizing pass transistor 486 and n-channel transistor 488 the same size as pass transistor 407 and n-channel transistor 406 of SRAM cell 405, or the same size as pass transistor 408 and n-channel transistor 409 of SRAM cell 410. However, these alternatives alone would not generate the correct reference voltage at bitline 450.

Therefore, conventionally, the p-channel bitline load transistors 434 and 436 would be sized accordingly to generate the correct reference voltage which is the average of the first and second voltage read from SRAM cells 405 and 410. This results in p-channel bitline load transistors 434 and 436 having different sizes than p-channel transistors 415, 425, 422 and 430. In a conventional design, when process parameters (e.g. sheet resistance, n-channel and p-channel threshold voltages, gate lengths and widths, etc.) shift in the manufacturing process, or operating conditions (e.g. Vcc or temperature) change, the fact that only the p-channel bitline load transistors have been sized results in the reference voltage tracking poorly with these changes, that is, not maintaining an average of the first and second voltages read from SRAM cells 405 and 410. The "size" of p-channel and n-channel transistors refers to, for example, transistor geometries such as transistor gate length and gate width. The terms transistor gate length and gate width hereafter referred to are given their conventional meanings. For further explanation of these terms, see FIG. 2.1, page 40 of text "Analysis and Design of Digital Integrated Circuits," by Hodges and Jackson, 1983.

In contrast to conventional memory arrays, p-channel bitline load transistor 434 of memory array 400 comprises the same size as p-channel transistors 415 and 425. In like manner, p-channel bitline load transistor 436 comprises the same size as p-channel transistors 422 and 430. Furthermore, dummy cell 432 differs from SRAM cells 405 and 410, in that when a logic level is read from either SRAM cell 405 or 410, dummy cell 432 provides a reference voltage to bitline 450 and draws a different amount of current than the current drawn by SRAM cells 405 or 410. Given that p-channel load transistor 434 comprises the same size as p-channel transistors 415 and 425, and given that p-channel load transistor 436 comprises the same size as p-channel transistors 422 and 430, dummy cell 432 can be designed to draw an amount of current which will result in a desired reference voltage provided onto bitline 450. For example, dummy cell 432 can be designed to draw a current which is less than the current drawn by SRAM cells 405 and 410 when a low logic level is read from SRAM cells 405 and 410.

In one embodiment, dummy cell 432 can be designed to couple a reference voltage to bitline 450 which comprises a value in between the first and second voltages read from SRAM cells 405 and 410. The value may approximately comprise the average of the first and second voltages read from SRAM cells 405 and 410. By adjusting the size of pass transistor 488, dummy cell 432 may be designed to draw approximately half the current (plus or minus twenty percent) drawn by SRAM cells 405 or 410 when a low logic level is read from SRAM cells 405 or 410. It will be appreciated that the amount of current drawn by dummy cell 432 is preferably designed to couple a reference voltage to bitline 450 which maximizes noise immunity, that is, a reference voltage which is the average of the first and second voltages read from SRAM cells 405 and 410. However, dummy cell 432 may be designed to draw any amount of current which is less than the current drawn when a low logic level is read from either SRAM cell 405 or 410.

Pass transistor 488 has an associated gate length and gate width as does each of pass transistor 407 of SRAM cell 405 and pass transistor 408 of SRAM cell 410. In this embodiment, dummy cell 432 will draw approximately half the current (plus or minus percent) of SRAM cells 405 and 410 when the gate width of pass transistor 488 is approximately half the size (plus or minus twenty percent) of the gate width of pass transistors 407 and 408. Alternatively, dummy cell 432 will draw approximately half the current of SRAM cells 405 and 410 when the gate length of pass transistor 488 is approximately twice the size (plus or minus twenty percent) of the gate length of the pass transistors 407 and 408. It will be also be appreciated that pass transistor 488 may also comprise multiple individual transistors coupled in parallel or in series to achieve the desired transistor sizing ratios between dummy cell 432 and SRAM sells 405 and 410.

The sizing of dummy cell 432 as described by the present invention, provides a reference voltage which tracks well with process shifts and changes in operating conditions. Given that the p-channel bitline load 434 matches the sizes of the p-channel transistors 415 and 425, and that p-channel bitline load 436 matches the sizes of p-channel bitline loads 422 and 430, process shifts or changes in operating conditions which affect p-channel transistors will affect SRAM cells 405 and 410 in the same proportion that they affect dummy cell 432. Moreover, given that pass transistor 488 is sized proportionally to pass transistors 407 and 408 of SRAM cells 405 and 410, any process shifts or changes in operating conditions that affect n-channel transistors will affect dummy cell 432 in the same proportion that they affect SRAM cells 405 and 410. Thus, the reference voltage provided by dummy cell 432 will track shifts in the process and changes in the operating conditions in order to provide a reference voltage which maintains its relationship to the first and second voltages read from SRAM cells 405 and 410.

It will be appreciated by one of ordinary skill in the art, that although the present invention of dummy cell 432 has been described with reference to cross-coupled CMOS inverters included within SRAM cells 405 and 410 and dummy cell 432, the present invention may be practiced using other well-known memory cell configurations know in the art without departing from the scope and spirit of the present invention. Examples of other well-known memory cell configurations include NMOS or PMOS cross coupled inverters (with or without resistive loads or TFT loads), or memory cells storing a single high or low state. Additionally, dummy cell 432 may comprise only n-channel transistor 486 and pass transistor 488. In this configuration, n-channel transistor 486 is biased to conduct current and pass transistor 488 is sized as described above such that dummy cell 432 draws an appropriate amount of current relative to a memory cell in a memory array. Additionally, the present invention has been described with reference to memory array 400. It will appreciated by one of ordinary skill in the art that the spirit and scope of the present invention incorporates any memory array comprising memory cells, circuitry for reading a state stored in the memory cells, and a dummy cell which provides a reference voltage and which draws an amount of current less than the current drawn by a memory cell that is being read.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A memory array comprising:
 a storage element for storing one of a first state and a second state, wherein said storage element includes a first pass transistor having a first width and a first length;
 circuitry coupled to said storage element for reading said one of said first state and said second state from said storage element, said storage element drawing a first current when said first state is read by said circuitry; and a dummy cell coupled to said storage element and said circuitry, said dummy cell providing a reference voltage when said circuitry reads said one of said first state or said second state from said storage element, said dummy cell drawing a second current when said first state is read from said storage element, wherein the second current is not equal to the first current, and wherein said dummy cell includes a second pass transistor having a second width and a second length.

2. The memory array of claim 1, wherein:

said second width of said second pass transistor is approximately half said first width of said first pass transistor.

3. The memory array of claim 1, wherein:

said second length of said second pass transistor is approximately twice said first length of said first pass transistor.

4. The memory array of claim 1, wherein said circuitry comprises:

a bitline coupled to said first pass transistor;

a wordline coupled to said first pass transistor and said second pass transistor, said wordline biasing said first pass transistor to enable said first or second state to be read from said storage element to said bitline, said wordline biasing said second pass transistor to enable said dummy cell to provide said reference voltage; and a sense amplifier having a first input and a second input, said first input coupled to said storage element, said second input coupled to said dummy cell.

5. The memory array of claim 4, wherein:

said first pass transistor couples a first voltage to said bitline when said first state is read from said storage element;

said first pass transistor couples a second voltage to said bitline when said second state is read from said storage element; and said reference voltage provided by said dummy cell comprises a value between said first and second voltage.

6. The memory array of claim 1, wherein:

a first pass transistor provides a first voltage when said first state is read from said storage element;

said first pass transistor provides a second voltage when said second state is read from said storage element; and said reference voltage provided by said dummy cell comprises a value between said first and second voltage.

7. The memory array of claim 1, wherein said second current is less than said first current.

8. The memory array of claim 1, wherein said second current is approximately half the first current.

9. A circuit for storing and reading data comprising:

first and second storage elements having two stable points including a first side for storing a first state and a second side for storing a second state opposite said first state;

a first bitline coupled to said first side of said first storage element;

a second bitline coupled to said first side of said second storage element;

a third bitline coupled to said first and second storage elements to control an operating voltage supplied across said first and second storage elements;

a control circuit coupled to said first, second and third bitlines, said control circuit for reading said first state from said first or second storage elements; and a dummy cell coupled to said first and second storage elements, said dummy cell providing a reference voltage when said control circuit reads said first state from said first or second storage elements.

10. The circuit as set forth in claim 9, wherein:

said control circuit generates a first voltage across said first storage element via said third bitline that is lower than said operating voltage and generates a second voltage lower than said operating voltage on said second bitline when storing a low logic level on said second side of said first storage element, and generates said first voltage across said second storage element and said second voltage on said first bitline when storing a low logic level on said second side of said second storage element.

11. The circuit as set forth in claim 9, wherein:

said first storage element or said second storage element draws a first current when said control circuit reads said first state comprising a low logic level;

said dummy cell draws a second current when said control circuit reads said first state from said first or Second storage elements, said second current not equal to said first current.

12. The circuit as set forth in claim 11, wherein:

said second current is less than said first current.

13. The circuit as set forth in claim 11, wherein:

said second current is approximately half said first current.

14. The circuit as set forth in claim 9, wherein:

said first storage element comprises a five transistor static random access memory (SRAM) cell including a first pair of cross coupled inverters and a first pass transistor having a first length and first width coupled to said first side of said first storage element;

said second storage element comprises a five transistor SRAM cell including a second pair of cross coupled inverters and a second pass transistor having a second length and second width coupled to said first side of said second storage element; and said dummy cell comprises a five transistor SRAM cell including a third pair of cross coupled inverters and a third pass transistor having a third length and third width and coupled to a side of said third pair of cross coupled inverters.

15. The circuit of claim 14, wherein:

an input of one of said third pair of cross coupled inverters is coupled to ground.

16. The circuit of claim 14, wherein:

said third width of the third pass transistor is approximately half the first width of the first pass transistor and approximately half the second width of the second pass transistor.

17. The circuit of claim 14, wherein:

said third length of the third pass transistor is approximately twice the first length of the first pass transistor and approximately twice the second length of the second pass transistor.

18. The circuit as set forth in claim 9, wherein:

a first read voltage is coupled to said first bitline when said control circuit reads said first state comprising a high logic level;

a second read voltage is coupled to said first bitline when said control circuit reads said first state comprising a low logic level; and said reference voltage provided by said dummy cell comprises a value in between said first and second read voltages.

* * * * *